Figure 3A:
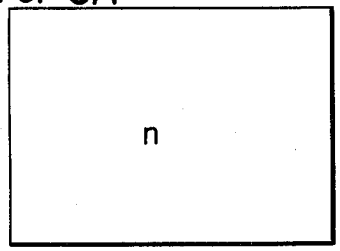

United States Patent [19]

Momma et al.

[11] 4,402,001
[45] Aug. 30, 1983

[54] SEMICONDUCTOR ELEMENT CAPABLE OF WITHSTANDING HIGH VOLTAGE

[75] Inventors: Naohiro Momma; Hiroyuki Taniguchi, both of Hitachi, Japan

[73] Assignee: Hitachi, Ltd., Tokyo, Japan

[21] Appl. No.: 868,791

[22] Filed: Jan. 12, 1978

[30] Foreign Application Priority Data

Jan. 24, 1977 [JP] Japan .................. 52-5787

[51] Int. Cl.³ .................. H01L 29/74; H01L 29/06
[52] U.S. Cl. .................. 357/38; 357/20;88;90;91; 29/580
[58] Field of Search .................. 357/20, 38, 88, 90; 29/580

[56] References Cited

U.S. PATENT DOCUMENTS

| | | | |
|---|---|---|---|
| 3,128,530 | 4/1964 | Rouse et al. | 357/88 |
| 3,154,838 | 11/1964 | Bullough et al. | 357/88 |
| 3,249,831 | 5/1966 | New et al. | 357/88 |
| 3,258,371 | 6/1966 | Sukegawa | 357/90 |
| 3,260,624 | 7/1966 | Wiesner | 357/90 |
| 3,338,758 | 8/1967 | Tremere | 357/90 |
| 3,362,858 | 1/1968 | Knopp | 357/90 |
| 3,363,151 | 1/1968 | Chopra | 357/63 |
| 3,427,515 | 2/1969 | Blicher et al. | 357/90 |
| 3,442,724 | 5/1969 | Gluck et al. | 357/88 |
| 3,461,359 | 8/1969 | Raithel et al. | 357/88 |
| 3,535,171 | 10/1970 | Hughes | 357/63 |
| 3,538,401 | 11/1970 | Chu | 357/90 |
| 3,777,227 | 12/1973 | Krishna et al. | 357/63 |

Primary Examiner—Andrew J. James
Attorney, Agent, or Firm—Antonelli, Terry & Wands

[57] ABSTRACT

A semiconductor element such as a thyristor or a transistor which is capable of withstanding a high voltage comprises a semiconductor substrate of a pnpn-four layer structure (for a thyristor) or of a npn-three layer structure (for a transistor). An intermediate p-type layer is composed of a low concentration layer region located adjacent to an n-type layer and a high concentration layer region located adjacent to the other n-type layer. The high concentration layer region is formed through diffusion of aluminium so that the maximum concentration thereof becomes at least equal to $5 \times 10^{16}$ atoms/cm³. A method of manufacturing such semiconductor element is also disclosed.

12 Claims, 13 Drawing Figures

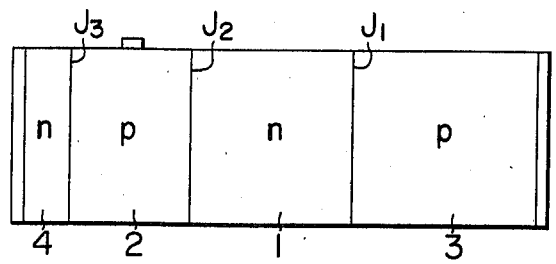
FIG. IA
PRIOR ART
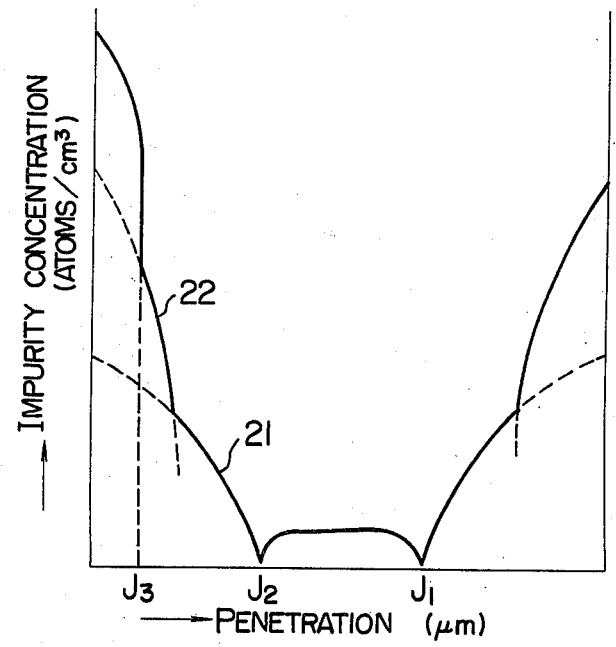
FIG. IB
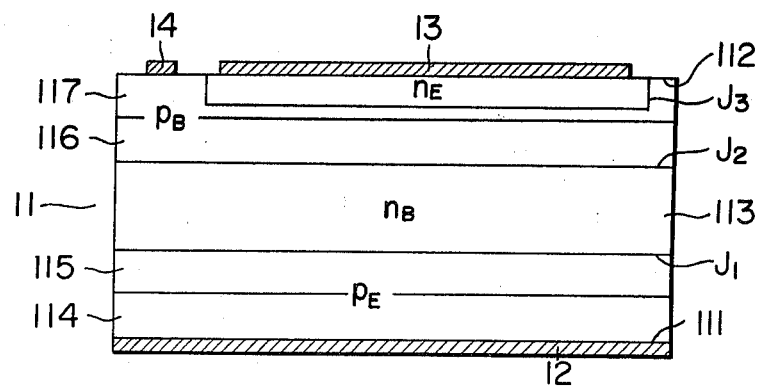
FIG. 2

SEMICONDUCTOR ELEMENT CAPABLE OF WITHSTANDING HIGH VOLTAGE

The present invention relates in general to a semiconductor element and in particular to a semiconductor device which has a p-type layer including a first layer region having a low impurity concentration and a second layer region of a high impurity concentration and which is capable of withstanding a high voltage and thus is referred to also as high voltage rated semiconductor device.

As is shown in FIG. 1A, a pnpn-type thyristor is generally manufactured in such a manner that an n-conductivity type substrate 1 is diffused with a p-conductivity type impurity at both surfaces thereof thereby to form a p-type base layer 2 at one surface, while the p-type layer 3 formed at the other surface is intended to serve as the emitter layer with the interposed n-type portion of the substrate being used as a second base layer. Additionally, an n-type layer 4 is formed on the p-type base layer 2 to serve as another emitter layer. The forward voltage which the thyristor can withstand is determined by a pn-junction $J_2$ formed between the p-type base layer 2 and the n-type base layer 1. In this connection, it is known that such voltage-withstanding capability of the thyristor can be enhanced by reducing the gradient of the impurity concentration distribution in the p-type base layer 2 at a region in the vicinity of the pn-junction $J_2$. However, when the p-type base layer 2 is to be formed through a single process of diffusion of the p-type impurity, an effort to obtain a low or reduced gradient of impurity concentration in the region adjacent to the pn-junction $J_2$ would be necessarily accompanied by a lowered or decreased impurity concentration in the p-type base layer 2 which constitutes a pn-junction $J_3$ together with the n-type emitter layer 4. This in turn will disadvantageously result in deteriorations in the thyristor characteristics other than the forward voltage-withstanding capability such that the gate firing current becomes excessively small, the raise-up rate dv/dt of the forward voltage is reduced, and so forth.

As an attempt to avoid such disadvantage, it is known that two kinds of impurities are used to form the p-type base layer having two different concentration profiles, as disclosed in U.S. Pat. No. 3,249,831 or corresponding DOS-1439958. In more detail, the p-type base layer is so formed that it comprises a layer portion 21 having a great diffusion depth in combination with a low gradient of concentration distribution and a layer portion 22 having a small diffusion depth in combination with a high gradient of concentration distribution, whereby the overall concentration profile becomes discontinuous, as is illustrated in FIG. 1B. This known method certainly contributes to improve the voltage-withstanding capability of the thyristor by reducing the gradient of impurity concentration at the region of the pn-junction $J_2$, while the impurity concentration at the junction $J_3$ is increased thereby to prevent an abnormally high sensitivity to the gate firing current and at the same time to prevent the raise-up rate of the allowable forward voltage (dv/dt) from being decreased. However, there arises a problem in respect to the lifetime of the minority carriers when the above method is applied to the manufacture of a semiconductor element rated for a high voltage, i.e. capable of withstanding a high voltage. More specifically, in the case of a high voltage rated semiconductor element, the width of the base layer in which the impurity concentration is maintained at minimum tends to be enlarged, thereby producing eventually a relatively high voltage drop across the base layer and hence a correspondingly increased thermal loss in the electrically conductive state. In order to reduce such thermal loss to a minimum, it is necessary to lengthen the lifetime of the minority carriers in the base layer. For example, at the rated voltage of 3000 V, the lifetime of the minority carriers should be longer than 50 $\mu$sec. Since the low concentration layer portion 21 of the p-type base layer having two different concentration gradients described above is usually formed through diffusion of aluminum as the impurity, the lifetime of the minority carriers is reduced to 10 $\mu$sec. or less. On the other hand, the high concentration layer portion 22 of the p-type base layer of two discontinuous concentration profiles is usually formed through diffusion of boron or gallium, whereby the lifetime of the minority carriers in the base layer is more or less increased. However, such diffusion of boron or gallium can assure a lifetime increased only up to 20 $\mu$sec. at the highest even if the diffusion is effected to a maximum of the solid solubility for obtaining a maximum concentration. Besides, because the distribution of impurity concentration will take a steeper gradient as the impurity concentration is increased at the surface of the high concentration layer region 22 in an effort to improve the lifetime of the minority carrier, a slight variation in the depth of the other pn-junction $J_3$ to be formed would result in remarkable variations in the gate firing characteristic and the raise-up rate of the allowable forward voltage (dv/dt), involving a poor reproducibility of the uniform characteristics in the finished semiconductor elements. For these reasons, it has been hitherto practically difficult to manufacture semiconductor elements or devices which are susceptible to the thermal loss and at the same time exhibit uniform performance characteristics.

An object of the invention is to provide an improved semiconductor element which is capable of withstanding a high voltage and avoids the drawbacks of the hitherto known semiconductor elements such as described above.

Another object of the invention is to provide a method of manufacturing a high voltage rated semiconductor element which is free from the disadvantages of the hitherto known elements.

More specifically, the invention is to provide an improved semiconductor element which has a p-type layer composed of a high impurity concentration region and a low impurity concentration region and in which the lifetime of the minority carriers is significantly extended. The invention also contemplates provision of a method of manufacturing the same.

In view of the above and other objects which will become more apparent as the description proceeds, there is proposed according to an aspect of the invention a semiconductor element capable of withstanding a high voltage in which a p-conductivity type base layer is composed of a first layer region of a low impurity concentration and a second layer region of a high impurity concentration in two discontinuous different distribution profiles of impurity, wherein the second layer region is formed through diffusion of aluminium serving as the impurity. In a specific embodiment of the invention, the first layer region of the p-type base layer is formed through diffusion of an impurity such as aluminium, boron or gallium, while the second layer region is formed by diffusing aluminium as the impurity dopant. According to the teachings of the invention, it is possible to obtain a high voltage rated semiconductor element in which the lifetime of the minority carriers can be significantly extended as compared with the hitherto known semiconductor element having a p-type base layer of two discontinuous diffusion regions in which the second layer region of a higher impurity concentration is formed through diffusion of boron or gallium, without requiring a high impurity concentration near to the maximum solid solubility in the second layer. More particularly, even when a semiconductor substrate exhibiting a lifetime of the minority carriers shorter than 10 μsec (after the formation of the first layer) is diffused with boron or gallium up to the respective maximum solid solubilities, it is impossible to attain a lifetime exceeding 20 μsec. On the contrary, diffusion of aluminium according to the invention with concentration greater than $5 \times 10^{16}$ atoms/cm$^3$ which is apparently smaller than the maximum solid solubility (of about $10^{19}$ atoms/cm$^3$) will allow a lifetime of the minority carriers of about 50 μsec to be attained. It has been experimentally found that the concentration of $5 \times 10^{16}$ atoms/cm$^3$ is not always required in the finished state of the fabricated semiconductor element but the fact that such maximum concentration has been at least once experienced during the manufacture of the semiconductor element is sufficiently effective to lengthen the lifetime of the minority carriers. In reality, it has been experimentally confirmed that the lifetime of the minority carriers will remain shorter than 10 μsec unless the maximum concentration has attained a value higher than $5 \times 10^{16}$ atoms/cm$^3$ at least once during the diffusion step of aluminium.

As will be appreciated from the foregoing description, it is possible to provide a relatively gentle gradient of impurity concentration to the second layer region of the p-type layer having two discontinuous concentration profiles in the semiconductor element according to the invention. Furthermore, in the case of thyristors and transistors, when the impurity distribution is made such that the maximum concentration is attained at an inner region rather than at the surface of the second layer region, it is then possible to form a junction between the n-type emitter layer and the p-type base layer in the vicinity of the zone at which the maximum concentration is attained, whereby the average resistance $R_{PB}$ of the p-type base layer can be controlled with a high accuracy. Although the diffusion of aluminium can be carried out in any convenient manner so far as the concentration of aluminium sufficient for forming the high concentration region can be assured, diffusion under vacuum is preferred in view of the uniformity of diffusion attainable.

FIG. 1A schematically shows a structure of a hitherto known thyristor.

FIG. 1B graphically illustrates a distribution of impurity concentration in the thyristor shown in FIG. 1A.

FIG. 2 schematically shows a structure of a thyristor having a p-type base layer of discontinuous impurity concentration profiles according to an embodiment of the invention.

FIGS. 3A to 3G show steps of manufacturing a thyristor according to the invention.

Figure 4:
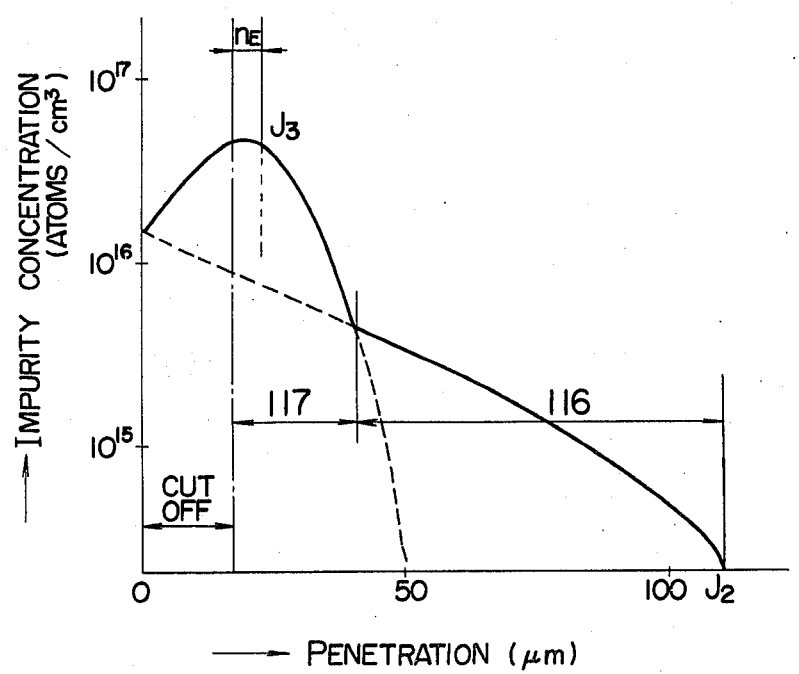

FIG. 4 graphically illustrates distribution of impurity concentrations in a thyristor according to the invention.

Figure 5:
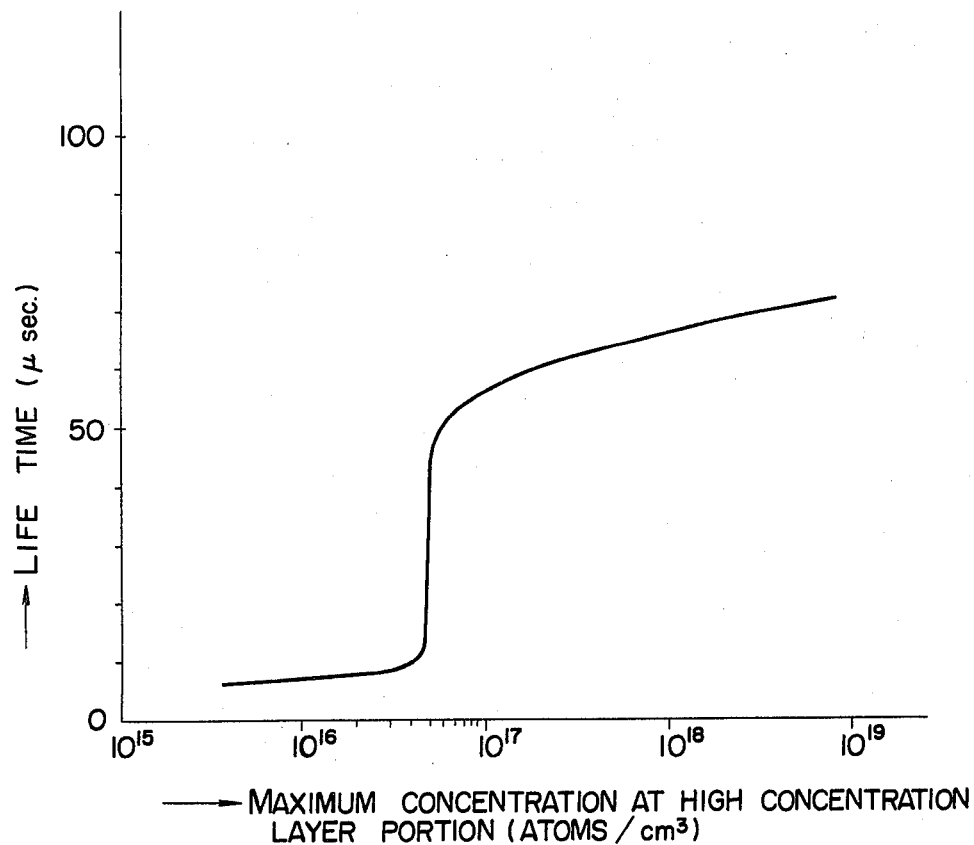

FIG. 5 graphically illustrates a relationship between maximum concentration of aluminium at the high concentration region of p-type base layer and lifetime of the minority carrier.

Figure 6:
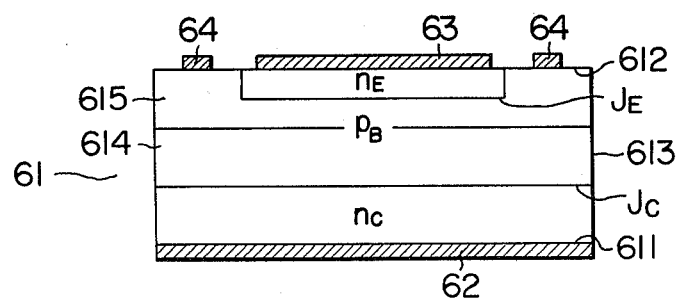

FIG. 6 schematically shows a structure of a transistor constructed according to the invention.

Referring to FIG. 2 which schematically shows a thyristor constructed according to the teachings of the invention, numeral 11 denotes a semiconductor substrate which includes a pair of major surfaces 111 and 112 disposed in opposition and substantially in parallel to each other, side surfaces 113 for bridging the major surfaces 111 and 112 to each other and four contiguous layers $P_E$, $n_B$, $P_B$ and $n_E$ disposed between the major surfaces 111 and 112 and having alternately different conductivity types. The layer $P_E$ is composed of a high concentration layer region 114 located adjacent to the one major surface 111 and a low concentration region 115 located adjacent to the high concentration region 114. The layer $P_E$ serves as a p-type emitter layer. The layer $n_B$ is disposed adjacent to the low concentration layer region 115 of the p-type emitter layer $P_B$ to form a first pn-junction $J_1$ in cooperation with the low concentration layer region 115, thereby to serve as a n-type base layer. The layer $P_B$ is composed of a low concentration layer region 116 which forms a second pn-junction $J_2$ in cooperation with the adjacent n-type base layer $n_B$ and a high concentration layer region 117 formed through diffusion of aluminium adjacent to the low concentration layer region 116, thereby to serve as a p-type base layer. The layer $n_E$ is embedded within the high concentration layer region 117 of the p-type base layer $P_B$ having a major surface exposed at the one major surface 112 of the substrate and forms a third pn-junction $J_3$ in cooperation with the high concentration layer region 117. The layer $n_E$ serves as an n-type emitter layer. It will be understood that the high concentration layer region 114 is formed so as to have a higher impurity concentration than the low concentration layer region 115. On the other hand, the low concentration layer region 115 is at a higher concentration than the n-type base layer $n_B$, the n-type emitter region $n_E$ is at a higher concentration than the high concentration layer region 117, which in turn has a higher concentration than the low concentration layer region 116, while the latter is formed to have a higher concentration than the layer $n_B$. The first and second pn-junctions $J_1$ and $J_2$ extend substantially in parallel with the major surfaces 111 and 112 and terminate in the side surfaces. The third pn-junction $J_3$ has a major portion extending substantially in parallel with the major surfaces and terminates in the major surface 112. Reference numeral 12 denotes a main electrode which is contacted to the high concentration layer region 114 at the one major surface 111 with low ohmic resistance, while numeral 13 denotes a counterpart main electrode contacted to the n-type emitter layer $n_E$ at the other major surface 112 with a low ohmic resistance. Numeral 14 denotes a gate electrode contacted to a high concentration layer region 117 at the major surface 112.

Figure 3B:
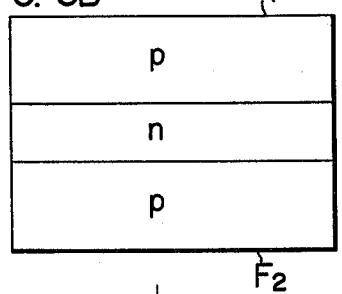
Figure 3C:
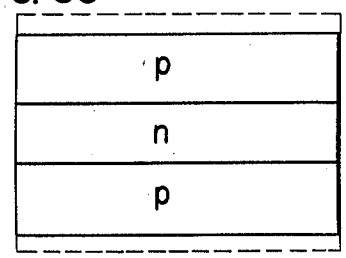
Figure 3D:
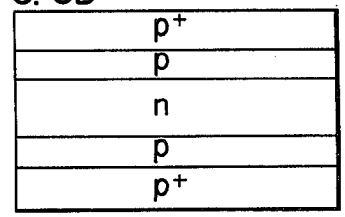
Figure 3E:
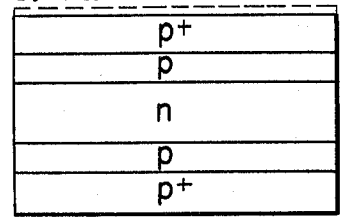
Figure 3F:
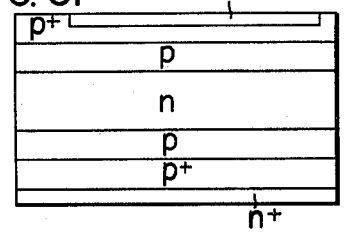
Figure 3G:
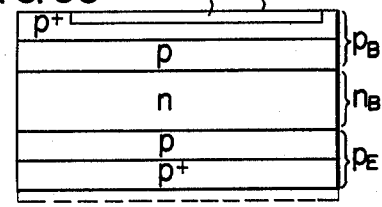

The thyristor having the structure described above is fabricated through a manufacturing processes illustrated in FIGS. 3A to 3G. The substrate as used is a n-type silicon wafer manufactured in the floating zone method, which has resistivity of about 200 Ωcm, a diameter of 60 mm and a thickness of 1050 μm (FIG. 3A). In a quartz ampoule filled with argon, diffusion of aluminium is carried out with an aluminium wire employed as an aluminium source for 75 hours at 1250° C., thereby to form a p-type diffusion layer on both surfaces of the silicon wafer with a surface impurity concentration of about $3 \times 10^{16}$ atoms/cm$^3$ and depth of diffusion or penetration of about 170 μm (FIG. 3B). Next, one surface (represented by F$_1$) is etched away to a depth of about 55 μm, while the other surface (represented by F$_2$) is etched away to a depth of about 30 μm (FIG. 3C). As a result, the surface concentrations at the surfaces F$_1$ and F$_2$ become equal to $9 \times 10^{15}$ and $18 \times 10^{16}$ atoms/cm$^3$, respectively. Subsequently, diffusion of Al (predeposition) is carried out in an evacuated and sealed quartz ampoule with an aluminium wire used as the aluminium source for about 2 hours at 1080° C., which is then followed by a thermal process (for driving-in the impurity atoms) in a flow of nitrogen for five hours at 1250° C. Through the predeposition of Al and the succeeding drive-in process, a p$^+$-type layer of a high concentration is formed in the range of about 50 μm in depth from the wafer surface with a maximum concentration value of about $6 \times 10^{16}$ atoms/cm$^3$ attained at a location of about 25 μm in depth (FIG. 3D). After the surface F$_1$ is etched away for about 18 μm (FIG. 3E), phosphorus is diffused into both surfaces of the wafer from a source of POCl$_3$ at 1100° C. thereby to form an n-type layer of 7 μm thick (FIG. 3F). Finally, in order to remove the n-type layer from the surface F$_2$, the latter is etched away by a thickness of about 30 μm (FIG. 3G). In this manner, there is fabricated a four layer substrate for a thyristor having an n-type emitter layer n$_E$, a p-type base layer P$_B$, a n-type base layer n$_B$ and a p-type emitter layer P$_E$ arranged sequentially in this order as counted from the surface F$_1$. Thereafter, the main electrodes and the gate electrode are formed by a known process, to complete a thyristor of the structure such as shown in FIG. 2.

The distribution of impurity concentration in the p-type base layer P$_B$ of the thyristor takes a profile shown in FIG. 4. The junction J$_3$ is located at the zone or area in which the impurity concentration attains the maximum value. When the average value of resistance of the p-type base 2 is selected at 450 Ω in designing a practical thyristor in accordance with the teachings of the invention, deviations from this value can be suppressed within a range of ±50 Ω. The finished thyristor is capable of withstanding a voltage of higher than 4000 V. The lifetime of the minority carriers in the n-type base region is in the order of 50 to 80 μsec with the forward voltage drop thereacross being suppressed at a value lower than 2.2 V.

For the thyristor manufactured in accordance with the invention, a relationship between the maximum concentration and the lifetime of the minority carriers in the high concentration layer region 117 is determined, which is graphically illustrated in FIG. 5. As can be seen from this graph, the lifetime of the minority carriers is in the vicinity of 10 μsec when the maximum concentration of the high concentration layer region 117 is lower than $5 \times 10^{16}$ atoms/cm$^2$. Beyond $5 \times 10^{16}$ atoms/cm$^3$, the lifetime of the minority carrier will increase to 50 μsec. Furthermore, beyond $1 \times 10^{17}$ atoms/cm$^3$, the lifetime tends to remain constant.

FIG. 6 shows a structure of a transistor to which the invention is applied. In this figure, reference numeral 61 denotes a semiconductor substrate having a pair of major surfaces 611 and 612 disposed in opposition and substantially in parallel to each other and side surfaces 613 bridging the major surfaces 611 and 612 to each other. The substrate 61 incorporates therein three contiguous layers n$_C$, P$_B$ and n$_E$ of alternatively different conductivity types disposed between the major surfaces. More particularly, the layer n$_C$ is a n-type collector layer. The layer P$_B$ is composed of a low concentration layer region 614 which forms a collector junction J$_c$ in cooperation with the adjacent n-type collector layer n$_C$ and has a lower concentration than the latter and a high concentration layer region 615 which is located adjacent to the low concentration layer region 614 and has a higher concentration than the latter. The layer P$_B$ serves as the p-type base layer. The layer n$_E$ is an n-type emitter layer which is embedded within the high concentration layer region 615 of the p-type base layer P$_B$ so as to be exposed at the major surface 612 and constitutes an emitter junction J$_E$ together with the region 615. Numeral 62 denotes a collector electrode contacted to the n-type collector layer n$_C$ at the one major surface 611 with a low ohmic resistance, while 63 denotes an emitter electrode contacted to the n-type emitter layer n$_E$ at the other major surface 612 with a low ohmic resistance. Finally, numeral 64 denotes a base electrode contacted to the high concentration layer region 615 of the p-type base layer P$_B$ at the other major surface 612 with a low ohmic resistance. In the case of such structure of a transistor as described above, the high concentration layer region 615 of the p-type base layer P$_B$ is formed through diffusion of aluminium so that the maximum concentration thereof attains a value greater than $5 \times 10^{16}$ atoms/cm$^3$. The relationship between the concentration in the high concentration region 615 and the lifetime of the minority carriers has been found to have a similar tendency as shown in FIG. 5. Thus, it is also possible to obtain a transistor capable of withstanding a high voltage and exhibiting a long lifetime of the minority carriers.

What is claimed is:

1. In a semiconductor element capable of withstanding a high voltage including a semiconductor substrate which has a pair of major surfaces disposed in opposition to each other, at least an n-conductivity type layer disposed interiorly of said substrate, a p-conductivity type layer disposed adjacent to said n-conductivity type layer and forming a pn-junction in cooperation with said n-conductivity type layer, said p-conductivity type layer being composed of a first layer region located adjacent to said pn-junction and a second layer region located remote from said pn-junction and having a higher impurity concentration than said first layer region, and a pair of electrodes each contacted to each of said major surfaces of said substrate with a low ohmic resistance, the improvement comprising:
    means for reducing thermal loss in said element by lengthening the lifetime of minority carriers in said n-conductivity type layer comprising aluminium diffused as an impurity in said second region of said p-conductivity layer.

2. A semiconductor element as set forth in claim 1, wherein said second layer region has a maximum concentration of aluminium higher than $5 \times 10^{16}$ atoms/cm$^3$.

3. A semiconductor element capable of withstanding a high voltage, comprising:
    a semiconductor substrate including a first layer of p-conductivity type, a second layer of n-conductivity type located adjacent to said first layer to form a first pn-junction in cooperation with said first layer and having a lower impurity concentration than said first layer, a third layer of p-conductivity type located adjacent to said second layer to form a second pn-junction in cooperation with said second layer and having a higher impurity concentration than said second layer, a fourth layer of p-conductivity type located adjacent to said third layer and having a higher impurity concentration than said third layer, the conductivity type of said fourth layer being determined by aluminium, and a fifth layer of n-conductivity type located adjacent to said fourth layer to form a third pn-junction in cooperation with said fourth layer and having a higher impurity concentration than said fourth layer;

a first main electrode contacted to the surface of said first layer of said semiconductor substrate with a low ohmic resistance, a second main electrode contacted to the surface of said fifth layer of said semiconductor substrate with a low ohmic resistance, and trigger means for applying to said semiconductor substrate a signal for switching a path between said first and second electrode into electrically conductive state from electrically non-conductive state.

4. A semiconductor element as set forth in claim 3, wherein said fourth layer has a maximum concentration higher than $5 \times 10^{16}$ atoms/cm$^3$.

5. A semiconductor element as set forth in claim 3, wherein a conductivity type of said third layer is determined by an impurity selected from a group consisting of aluminium, gallium and boron.

6. A semiconductor element as set forth in claim 5, wherein said fourth layer has a maximum concentration higher than $5 \times 10^{16}$ atoms/cm$^3$.

7. A semiconductor element capable of withstanding a high voltage comprising:

a first semiconductor layer of N-type conductivity;

a second semiconductor layer of P-type conductivity which forms first pn-junction in cooperation with the first semiconductor layer;

a third semiconductor layer of N-type conductivity which forms second pn-junction in cooperation with the second semiconductor layer;

said second semiconductor layer being comprised of first region of a low impurity concentration and second region of a high impurity concentration, and said second region including aluminium as the impurity.

8. A semiconductor element as set forth in claim 7, wherein said second region includes aluminium diffused under vacuum as the impurity.

9. A semiconductor element as set forth in claim 7, wherein said first and second regions have gradient of the impurity concentration distribution in which the gradient in said second region is higher than that of said first region.

10. A semiconductor element as set forth in claim 9, wherein the minimum impurity concentration part of said first region is near said first pn-junction and the maximum impurity concentration part of said second region is near said second pn-junction.

11. A semiconductor element as set forth in claim 10, wherein a maximum impurity concentration value in said second region is higher than $5 \times 10^{16}$ atoms/cm$^3$.

12. A semiconductor element as set forth in claim 10, wherein a maximum impurity concentration value in said second region is higher than $1 \times 10^{17}$ atoms/cm$^3$.

* * * * *